United States Patent [19]
Char

[11] Patent Number: 5,130,294
[45] Date of Patent: Jul. 14, 1992

[54] HIGH TEMPERATURE SUPERCONDUCTOR-CALCIUM TITANATE STRUCTURES

[76] Inventor: Kookrin Char, 704 Chimalus Dr., Palo Alto, Calif. 94306

[21] Appl. No.: 565,691

[22] Filed: Aug. 13, 1990

[51] Int. Cl.$^5$ .............................................. B32B 9/00
[52] U.S. Cl. ...................................... 505/1; 505/701; 505/702; 505/703; 505/704; 428/426; 428/433; 428/688; 428/901; 428/930
[58] Field of Search ..................... 505/1, 701, 702, 703, 505/704; 428/426, 433, 688, 901, 930

[56] References Cited

FOREIGN PATENT DOCUMENTS 1-130420  5/1989  Japan .

OTHER PUBLICATIONS

Multilayer $YBa_2Cu_3O_x$-$SrTiO_3$-$YBa_2Cu_3O_x$ Films for Insulating Crossovers, Kingston et al., Applied Physics Letters, Jan. 8, 1990.

$YBa_2Cu_3O_7$ Films Grown on Epitaxial MgO Buffer Layers on Sapphire, Talvacchio et al., Proceedings $M^2S$-HTSC, Stanford, Jul. 1989, Physica.

The Sputter Deposition and Characterization of Epitaxial Magnesium Oxide Thin Films and Their Use as a Sapphire/YBCO Buffer Layer, Morris et al., Proc. M.A.S., vol. 169, 1990.

Properties of Epitaxial $YBa_2Cu_3O_7$ Thin Films on $Al_2O_3$ (1012), Char et al., Appl. Phys. Lett. 56(8), 19 Feb. 1990, pp. 785–787.

*Primary Examiner*—Patrick J. Ryan

[57] ABSTRACT

A HTSC layered structure comprising a substrate such as calcium titanate and a HTSC film such as $YBa_2Cu_3O_7$. Use of a thin buffer layer of calcium titanate on sapphire provides a $YBa_2Cu_3O_{7-x}$ film with higher critical current.

11 Claims, 1 Drawing Sheet

HIGH TEMPERATURE SUPERCONDUCTOR-CALCIUM TITANATE STRUCTURES

TECHNICAL FIELD

This invention relates to high critical temperature superconducting (HTSC) films on calcium titanate substrate and, more particularly, this invention relates to the preparation of HTSC films on sapphire (aluminum oxide) substrates by the use of stable, epitaxial buffer layers of calcium titanate.

BACKGROUND OF THE INVENTION

The recent discovery of high critical temperature superconducting materials has created interest in the use of these materials in microwave devices. The HTSC metal cuprate materials cannot readily be produced in bulk with geometries and properties suitable for microwave devices. Presently, devices based on the HTSC materials are fabricated by formation of thin films on substrates by techniques similar to those used to fabricate semiconductor devices. To be useful in a microwave device the HTSC film must be grown on a substrate having low dielectric losses at high frequencies.

Silicon, a readily used substrate for semiconductor devices, cannot be used with the HTSC cuprate materials since at the temperature prevalent during deposition the cuprate reactants readily react with silicon. Sapphire ($Al_2O_3$) would appear to be an excellent substrate since it has a very low dielectric loss and is a strong, low cost, highly crystalline material available commercially in large sizes. Epitaxial films of a HTSC material such as $YBa_2Cu_3O_7$ can be grown on sapphire substrates. However, the optimum window of substrate temperatures during film deposition is relatively narrow [4]. At high temperatures, above about 700K, the $YBa_2Cu_3O_7$ thin film reacts with the sapphire, especially the Ba atoms. At low temperature, below about 650K, it is very difficult to produce thin $YBa_2Cu_3O_7$ films having good epitaxy.

There are other substrate materials that provide epitaxial growth of thin HTSC films with high superconducting transition temperatures and low surface resistance, such as strontium titanate ($SrTiO_3$), lanthanum aluminate ($LaAlO_3$), magnesium oxide (MgO) and yttria stabilized zirconia (YSZ). However, thick substrates of some of these materials, e.g. strontium titanate, exhibit too high an rf loss or do not have high enough mechanical strength to act as a substrate for large area microwave devices. Some of these substrates are not available in large sizes and/or are only available at high cost.

However, thin films of these epitaxial materials would not exhibit a high dielectric loss and would be useful as a buffer layer between the HTSC film and the sapphire substrate if they provided an epitaxial surface for the HTSC film and were stable and non-reactive with the HTSC film and the substrate.

LIST OF REFERENCES

1. Multilayer $YBa_2Cu_3O_x$- $SrTiO_3$ - $YBa_2Cu_3O_x$ Films For Insulating Crossovers, Kingston et al., Applied Physics Letters, Jan. 8, 1990.
2. $YBa_2Cu_3O_7$ Films Grown on Epitaxial MgO Buffer Layers on Sapphire, Talvacchio et al., Proceedings $M^2S$-HTSC, Stanford, July 1989, Physica.
3. The Sputter Deposition and Characterization of Epitaxial Magnesium Oxide Thin Films and Their Use as a Sapphire/YBCO Buffer Layer, Morris et al., Proc. M.A.S. Vol 169, 1990.
4. Properties of Epitaxial $YBa_2Cu_3O_7$ Thin Films on $Al_2O_3$ {012}, Char et al., Appl. Phys. Lett. 56(8) 19 Feb. 1990, p.785–787.

STATEMENT OF THE PRIOR ART

Kingston et al. [1] disclose a $MgO/YBCO/SrTiO_3/YBCO$ structure. MgO does not provide a fully compatible lattice match with HTSC films such as $YBa_2Cu_3O_7$ and polished MgO surfaces degrade in air with humidity. Talvacchio et al. [2] grew $YBa_2Cu_3O_7$ films on epitaxial MgO buffer layers on sapphire. This layered structure failed as a microwave device since the MgO was excessively moisture sensitive. The HTSC film did not have sufficient orientation and there were too many random grains. Morris et al. [3] formed an MgO buffer layer by sputter deposition at pressures between 5.5 to 7 Pa (about 40–50 m Torr). The resulting YBCO film grown on the epitaxial MgO has high normal state resistance and a broad superconducting transition.

As disclosed in copending application Ser. No. 495,568, filed Mar. 16, 1990 entitled HIGH TEMPERATURE SUPERCONDUCTOR—STRONTIUM TITANATE SAPPHIRE STRUCTURES (the disclosure of which is expressly incorporated herein by reference) the use of strontium titanate ($SrTiO_3$) as a buffer layer provides a HTSC layered structure on sapphire with high performance. Strontium titanate buffer layers provide an epitaxial film that has surface that facilitates growing high quality, high performance HTSC films. The $SrTiO_3$ buffer layer appears to be non-reactive with the barium ions in the YBaCuO layer.

Strontium titanate has some reactivity with the components of the growing HTSC film limiting the temperature that can be used during growth of the HTSC film to about 760° C. High quality HTSC film can be grown at higher temperature.

Though strontium titanate has a lattice spacing of about 3.92 Angstroms which is close to the approximate 3.9 Angstroms lattice spacing of $YBa_2Cu_3O_{7-x}$, it is far from the lattice spacing of sapphire (about 3.5 Angstroms). This lattice mismatch can cause some grains to grow in undesired directions.

Strontium titanate buffers must be deposited in a thickness of at least 100 Angstroms which increases microwave losses and is not conducive to the formation of the smoothest HTSC films.

STATEMENT OF THE INVENTION

Higher quality HTSC thin films are produced in accordance with the invention on calcium titanate substrates. The calcium titanate can be a bulk substrate or a thin buffer film or a substrate of different composition such as silicon or sapphire.

Calcium titanate has a lattice spacing of about 3.82 Angstroms which is intermediate to the lattice spacing of $YBa_2Cu_3O_{7-x}$ (~3.9 Angstroms) and sapphire (~3.5 Angstroms). Calcium titanate films can be grown with less strain. Thinner films have less dislocations and crystal defects. Epitaxial films of calcium titanate which are 100 Angstroms in thickness or less provide excellent substrates for growing thin HTSC films. Thinner buffer films provide lower microwave losses.

Furthermore since calcium titanate is less reactive with the ions forming the HTSC film, the deposition temperature can be substantially higher, e.g. about 800° C. which contributes to the quality and performance of the HTSC film. Preliminary measurements indicate that the critical current density of the HTSC film are about 2 times better than comparable films grown on strontium titanate buffer films on sapphire.

The invention provides a HTSC buffer layered structure on sapphire that is stable and suitable for microwave environments. The good thermal characteristics of sapphire and the reduction of noise provided by the calcium titanate also makes the layered structure useful in fabricating bolometers (infrared detectors).

The HTSC film can be grown over a wide temperature range without the HTSC reacting with the sapphire substrate or the buffer reacting with the substrate or the HTSC film. The layered structure of the invention provides the highest performance of any sapphire supported HTSC film reported to date. Others have reported surface resistance measuring on a par with copper. The layered sapphire supported HTSC structures of the invention exhibit of surface resistances 2 to 3 times better than copper at 10 GHz and 77K and much better than copper at lower temperatures. The YBCO films grown on the buffer layer exhibit low normal state resistance and a narrow superconducting transition.

The buffer layer in the HTSC structure of the invention is preferably grown in a high pressure process such as laser ablation or sputtering or metallo-organic compound vapor deposition (MOCVD). Talvacchio et al. [2] used electron beam deposition of an MgO film. Electron beam epitaxial deposition is conducted at relatively high vacuum, about $10^{-5}$ Torr. Morris et al. [3] deposited an MgO film at 40-50 m Torr. The low partial pressure of oxygen is believed to result in an oxygen deficient MgO buffer layer film. These films are chemically active and react with water which degrades the quality of the overlying HTSC film. Efforts to deposit lanthanum aluminate buffer layers were not successful.

The $CaTiO_3$ buffer layer in the layered structure of the invention is deposited at higher pressure which results in inert buffer layers with good epitaxial qualities. The $CaTiO_3$ buffer layers are excellent intermediate substrates for forming high performance, stable HTSC films.

These and many other objects and attendant advantages of the invention will become apparent as the invention becomes better understood by reference to the following and detailed descriptions when considered in conjunction with the accompanying drawings.

DETAILED DESCRIPTION OF THE INVENTION

Figure 1:
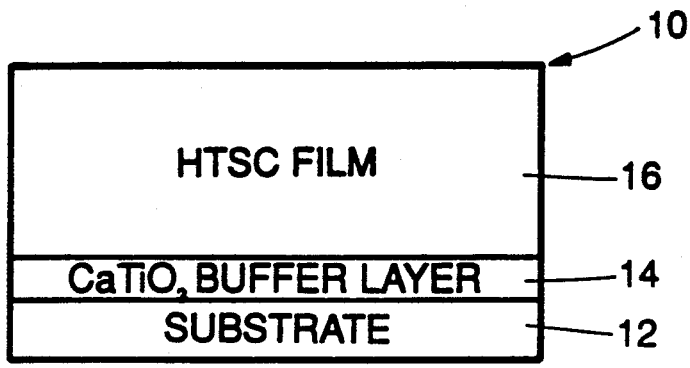
FIG. 1 is a schematic drawing of a layered HTSC-Buffer-Sapphire structure produced according to the process of this invention.
Figure 2:
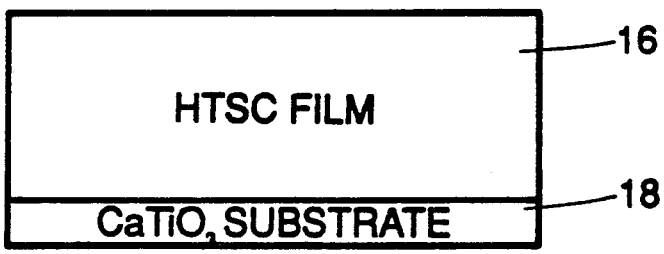
FIG. 2 is a schematic drawing of a HTSC film grown on bulk $CaTiO_3$.

Referring now to FIG. 1, the layered structure 10 is composed of a sapphire base or substrate 12, a thin buffer layer 14 and a HTSC layer 16. A thin HTSC 16 film can be directly grown on a bulk $CaTiO_3$ substrate 18 for applications where microwave absorption is not a concern. The buffer layer 14 and/or the HTSC layer 16 may be laid down in a pattern to form a device by use of a mask formed by conventional photolithographic techniques or by use of shutters or shields.

Sapphire or calcium titanate substrates are commercially available in high purity and in a variety of thicknesses and shapes. The support need only have sufficient thickness such as 0.1 millimeters to provide a mechanically strong substrate. Substrates having thicknesses above 1.0 millimeters would usually not be utilized since they add cost and weight to the device without providing any other benefit.

The calcium titanate buffer layer 14 is an epitaxial layer having sufficient thickness such that the growth of HTSC film is influenced solely by the calcium titanate buffer layer and not by the sapphire substrate. The buffer layer has a minimum thickness to cover the sapphire surface and any anomalies on the surface, suitably a thickness of at least 50 Angstroms. Thicknesses above about 3000 Angstroms are unnecessary and may interfere with the microwave device.

The layered structure of the invention may include an additional epitaxial film between the surface of the sapphire substrate and the strontium titanate layer such as a thin, (100 Angstrom to 1000 Angstrom) intermediate film of magnesium oxide, lanthanum aluminate or yttria stabilized zirconia (YSZ).

In the process of the invention, the thin layer of $CaTiO_3$ buffer is preferably formed by deposition in a chamber having a high percentage, usually from 10 to 100% of oxygen. The pressure in the chamber is higher than practiced in the electron beam deposition process and in other deposition processes. The pressure in the chamber is at least 100 m Torr and can be as high as 2 Torr, usually about 100 to 500 m Torr.

The buffer layer may be formed by a variety of vapor deposition techniques such as on- or off-axis sputtering, metallo-organic compound vapor deposition (MOCVD) or laser ablation.

Laser ablation and off-axis sputtering provide a buffer layer capable of providing the highest quality HTSC films. This may be due to several factors. Both laser ablation and off-axis sputtering are conducted at fairly high pressures. In the case of laser ablation the deposition chamber contains from 20 to 100% oxygen at a pressure typically from 0.1 Torr up to several Torr. The higher oxygen pressure could provide a more stable, more perfect crystalline epitaxial layer. Laser ablation generates its own plasma. The charged ionic species may assemble the $CaTiO_3$ into a more ordered crystal form. The laser is pulsed during laser ablation. During the non-pulsed period the growing crystal can relax to allow the metal and oxygen atoms to assume their positions in the crystal lattice of calcium titanate.

The HTSC film is preferably grown by off-axis sputtering, laser ablation or MOCVD. Any of these procedures can be used to form the buffer layer. A common chamber can be used to form the buffer layer and HTSC film by two consecutive laser-ablation depositions or two consecutive off-axis sputtering depositions.

In off-axis sputtering the sapphire substrate or the calcium titanate buffer layer coated sapphire substrate is placed on a heated substrate holder in a sputtering chamber at an angle of at least 40°, usually 90°, from the sputtering source. The substrate is heated to a temperature of from about 650° C. to 800° C.. The chamber contains from 10-50% of an oxidizing gas such as oxygen or nitrous oxide. The vapor source is a composite ceramic in the correct stoichiometric ratio for the film such as a $Y_1Ba_2Cu_3$ alloy or a $CaTiO_3$ crystal or pressed powder source. Deposition is usually conducted over several hours at a high pressure between 100 and 500 Torr. A post deposition treatment in oxygen at a temperature from 400° C. to 600° C. can be conducted in case of the HTSC film.

The films of high critical temperature ($T_c$) superconducting materials (HTSC) prepared in the present invention are metal cuprates having a $T_c$ above about 30K, usually above 70K. The HTSC materials have an ordered lattice and are usually crystalline ceramics of the general formula $$M_x^1 M_y^2 Cu_z O_n$$

where $M^1$ is a Group IIIA metal, Group IIIB metal, Group VB or a rare earth metal, $M^2$ is a Group IIA metal and x, y, z and n are integers. Usually the ratio of y:x is about 2:1 and the ratio of z:x is at least 3 usually from 3:1 to 6:1. The oxygen is present in an amount to satisfy valency of the metals and n is usually no more than 20, typically about 5–15.

$M_1$ can be a Group IIIA metal such as Yttrium (Y) or lanthanum (La), a Group IIIB metal such as Thallium (Tl), or Group VB metal such as Bismuth (Bi) or a rare earth metal such as Erbium (Er), Cerium (Ce), Praseodymium (Pr), Samarium (Sm), Europium (Eu), Gadolinium (Gd), Terbium (Tb), Dysprosium (Dy), Holmium (Ho), Ytterbium(Yb), Lutetium (Lu) or combinations of these metals. $M^2$ is a Group IIA metal such as strontium, barium, calcium or mixtures thereof.

The examples of practice of the invention will be directed to the YBaCuO materials of the general formula $Y_1Ba_2Cu_3O_{7-x}$, but the invention is equally applicable to other HTSC materials of the cuprate family such as the Bismuth cuprate of the general formula BiSrCaCuO or the thallium cuprate of the general formula TlBaCaCuO.

The invention will now be illustrated by specific examples. 500 Angstrom thick films of $YBa_2Cu_3O_7$ (123) were grown on 100 Angstrom thick buffer layers of $CaTiO_3$.

Both laser ablation and off-axis sputtering techniques were utilized in growing low surface resistance "123" films on $Al_2O_3$ with $CaTiO_3$ buffer layers. In the case of laser ablation about 1.8 Joule/cm² energy density of 248 nm wavelength pulsed excimer laser beam was focused on a $CaTiO_3$ or an "123" pellet. Other deposition parameters were 200 m Torr of oxygen pressure and 800° C. substrate temperature. In the case of off-axis sputtering two sputtering guns were mounted face to face and the substrates were glued on a heater that faces perpendicular to the both $CaTiO_3$ and "123" targets. Oxygen pressure of 40 m Torr and Argon pressure of 160 m Torr were used at the substrate temperature of 800° C.

Figure 3:
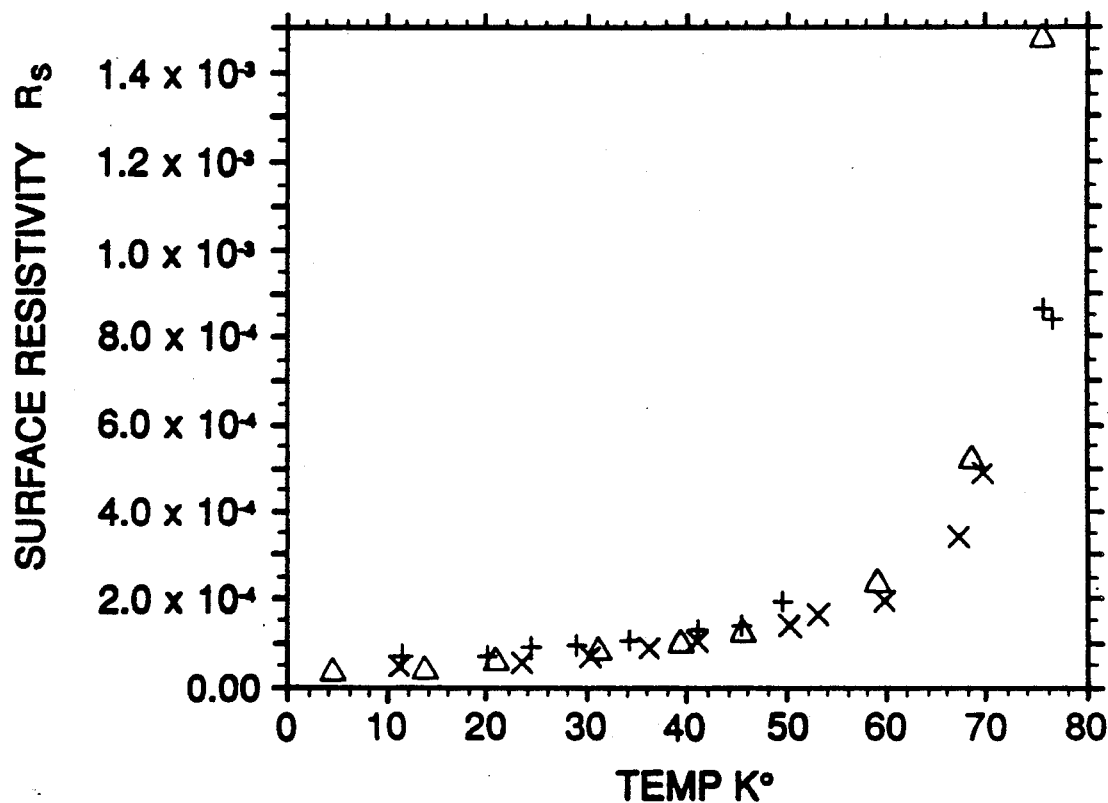
FIG. 3 is a graph of surface resistivity, $R_s$ versus temperature.

In order to measure surface resistance at microwave frequency a parallel plate resonator was formed by sandwiching two 1 cm by 1 cm "123" thin films face to face with a 12.5 μm thick Teflon dielectric in between. This resonator generates a series of transverse electromagnetic modes. The advantage of this method is that the current and field distribution can be calculated and the relation between the measured Q factor and the surface resistance $R_s$ can be deduced in a straightforward fashion. This method has been successfully used to measure 20 82 106 for Nb films at 4.2K at 10 GHz. The resolution of this method is about 5 μΩ at 10 GHz. FIG. 3 illustrates the data from 3 different measurements of the surface resistance of 500 Angstrom thick 123 films grown on 100 Angstrom thick $CaTiO_3$ buffer layers. The surface resistivity was scaled to 10 GHz.

In a measurement of x-ray scattering, it was found that the full width at half maximum, φ, of the peaks in the φ-scan is about 3.8 degree. In comparison, φ of good epitaxial films on MgO or $SrTiO_3$ is about 1.5 degree. However, unlike the data of the "123" thin films on bare sapphire [4], these peaks do not have the shoulders. In other words, the "123" films with a $CaTiO_3$ or $SrTiO_3$ buffer layer have better in-plane epitaxy than those without a $CaTiO_3$ or $SrTiO_3$ buffer layer.

It is known that the I-V characteristics of the grain boundary of two misaligned grains have Josephson junction behavior. It was further found by a weakly coupled grain model that these grain boundaries lead to higher surface resistance as well as longer penetration depth. Improved inplane epitaxy can be interpreted as reduction of grain boundaries, which results in lower surface resistance.

The mutual inductance response of a film as a function of temperature was measured at 1 kHz with a maximum magnetic field of 0.6 Gauss on the film surface. At 86.5K, the temperature where the mutual inductance transition starts, is in good agreement with the temperature where the dc resistivity goes to zero.

Improved microwave surface resistance data and critical current density are believed to be the results of better inplane epitaxy due to the use of the $CaTiO_3$ buffer layer.

It is to be realized that only preferred embodiments of the invention have been described and that numerous substitutions, modifications and alterations are permissible without departing from the spirit and scope of the invention as defined in the following claims.

What is claimed is:

1. A superconducting structure comprising:
   a sapphire substrate having a thickness of at least 0.1 multimeters;
   a thin buffer layer of calcium titanate having a thickness of no more than about 3,000 Angstroms deposited on a surface of the substrate; and
   a thin film of high temperature metal cuprate superconductor having a $T_c$ above about 30K deposited on a surface of the buffer layer.

2. A structure according to claim 1 in which the film is in the form of a pattern.

3. A structure according to claim 2 in which the film has a thickness of at least 100 Angstroms.

4. A structure according to claim 3 in which the superconductor is a cuprate of the formula:

$$M_x^1 M_y^2 Cu_x O_n$$

where $M^1$ is a Group IIIA metal, Group IIIB metal, Group VB or a rare earth metal, $M_2$ is a Group IIA metal and x, y, z and n are integers.

5. A structure according to claim 4 in which $M^1$ is selected from yttria, lanthanum, thallium, bismuth, erbium, cerium, praseodymium, samarium, europium, gadolinium, terbium, dysprosium, holmium, ytterbium, lutetium or combinations thereof.

6. A structure according to claim 5 in which $M^2$ is selected from barium, strontium, calcium or mixtures thereof.

7. A structure according to claim 6 in which $M^1$ is yttria and $M^2$ is barium.

8. A structure according to claim 7 in which the superconductor is $Y_1Ba_2Cu_3O_7$.

9. A superconducting structure comprising a thin film of high temperature metal cuprate superconductor having a $T_c$ above about 30K and having a thickness of at least about 100 Angstroms deposited on the surface of calcium titanate.

10. A structure according to claim 9 in which the calcium titanate is a thin buffer layer having a thickness from about 50 Angstroms to about 3,000 Angstroms deposited on a substrate.

11. A structure according to claim 10 in which the substrate is sapphire.

* * * * *

UNITED STATES PATENT AND TRADEMARK OFFICE
CERTIFICATE OF CORRECTION

PATENT NO. : 5,130,294
DATED : July 14, 1992
INVENTOR(S) : Kookrin Char

It is certified that error appears in the above-indentified patent and that said Letters Patent is hereby corrected as shown below:

```
Column 2, line 58, change "or" to --on--.
Column 3, lines 30-31, change "compound" to --chemical--.
Column 3, line 59, change "resistivity" to --resistance--.
Column 4, line 38, change "compound" to --chemical--.
Column 5, line 66, change "82 106" to -- µΩ --
In the Drawings, Fig. 3, change "RESISTIVITY to --RESISTANCE--.
```

Signed and Sealed this

Twenty-eighth Day of September, 1993

Attest:

BRUCE LEHMAN

*Attesting Officer*   *Commissioner of Patents and Trademarks*